(12) United States Patent
Liu

(10) Patent No.: US 8,421,180 B2
(45) Date of Patent: Apr. 16, 2013

(54) SEMICONDUCTOR STRUCTURE

(75) Inventor: Chu-Kuang Liu, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 13/480,491

(22) Filed: May 25, 2012

(65) Prior Publication Data

US 2012/0235231 A1    Sep. 20, 2012

Related U.S. Application Data

(62) Division of application No. 12/542,687, filed on Aug. 17, 2009, now Pat. No. 8,222,678.

(51) Int. Cl.
*H01L 29/78* (2006.01)

(52) U.S. Cl.
USPC .......... 257/476; 257/477; 257/478; 257/479; 257/E29.271

(58) Field of Classification Search .......... 257/476–479, 257/E29.271
See application file for complete search history.

(56) References Cited

U.S. PATENT DOCUMENTS

2003/0040144 A1 * 2/2003 Blanchard et al. ............ 438/145

* cited by examiner

*Primary Examiner* — Matthew W Such
*Assistant Examiner* — Robert Carpenter
(74) *Attorney, Agent, or Firm* — Jianq Chyun IP Office

(57) ABSTRACT

A semiconductor structure is provided. A second area is disposed between first and third areas. An epitaxial layer is on a substrate. A body layer is in the epitaxial layer in first and second areas. First and second gates are in the body layer and in a portion of the epitaxial layer. The first gate is in the substrate and partially in first and second areas. The second gate is in the substrate and partially in second and third areas. A first contact plug is in a portion of the body layer in the first area. A second contact plug is at least in the epitaxial layer in the third area and contacts the epitaxial layer and the second gate. The first contact plug is electrically connected to the second contact plug. A first doped region is in the body layer between the first contact plug and the first gate.

15 Claims, 10 Drawing Sheets

SEMICONDUCTOR STRUCTURE

CROSS-REFERENCE TO RELATED APPLICATION

This application is a divisional application of U.S. application Ser. No. 12/542,687, filed on Aug. 17, 2009, now pending. The entirety of the above-mentioned patent application is hereby incorporated by reference herein and made a part of this specification.

BACKGROUND OF THE INVENTION

1. Field of the Invention

The present invention relates to a semiconductor structure and a method of forming the same, and more particularly to a semiconductor structure integrating a power metal-oxide-semiconductor field effect transistor (power MOSFET) and a Schottky diode and a method of forming the same.

2. Description of Related Art

Power metal-oxide-semiconductor field effect transistors (power MOSFETs) are widely applied to switching devices such as power supplies, rectifiers, low-voltage motor controllers and the like. FIG. 1 illustrates a schematic cross-sectional view of a conventional power MOSFET. Referring to FIG. 1, an N-type epitaxial layer 12 is disposed on an N-type heavily-doped substrate 10. A gate 16 is disposed in the N-type epitaxial layer 12. A P-type body layer 14 is disposed in the N-type epitaxial layer 12 beside the gate 16. An N-type heavily-doped region 18 is disposed in the P-type body layer 14 beside the gate 16. A dielectric layer 20 is disposed on the gate 16 and the N-type heavily-doped region 18. A source metal layer 22 is disposed on the dielectric layer 20 and electrically connected to the N-type heavily-doped region 18. A drain metal layer 24 is disposed on the other side of the N-type heavily-doped substrate 10.

Along with an increasing demand for notebook computers and portable products, designs for sync-FETs having low output voltage, low forward voltage drop, low power loss and fast reverse recovery are required. However, due to the inherent PN diode between the P-type body layer 14 and the N-type epitaxial layer 12, the aforementioned requirements are hard to satisfy.

One known method is to integrate a power MOSFET with a Schottky diode to meet the above requirements. The current technology includes two types: silicon-in-one-package (SiP) and system-in-one-chip (SOC). The SiP places a power MOSFET in parallel with a Schottky diode. The formation process is simple, but the bonding wire connecting the power MOSFET and the Schottky diode produces parastitic inductances, so as to limit the overall efficiency. Although the SOC solves the parastitic inductances, the cell pitch thereof is relatively high (greater than 2 μm), so that the cell density can not be enhanced.

SUMMARY OF THE INVENTION

Accordingly, the present invention provides a semiconductor structure capable of integrating a power MOSFET and a Schottky diode effectively, so as to enhance the cell density thereof.

The present invention further provides a method of forming a semiconductor structure. The process thereof is simple and can be integrated with current processes.

The present invention provides a semiconductor structure including a substrate of a first conductivity type, an epitaxial layer of the first conductivity type, a body layer of a second conductivity type, a first gate, a second gate, a first contact plug, a second contact plug and a first doped region of the first conductivity type. The substrate has a first area, a second area and a third area. The second area is disposed between the first area and the third area. The epitaxial layer is disposed on the substrate. The body layer is disposed in the epitaxial layer in the first area and the second area. The first gate and the second gate are disposed in the body layer and in a portion of the epitaxial layer outside the body layer. The first gate is disposed in the substrate, partially in the first area and partially in the second area, and the second gate is disposed in the substrate, partially in the second area and partially in the third area. The first contact plug is disposed in a portion of the body layer in the first area. The second contact plug is at least disposed in the epitaxial layer in the third area and physically and electrically contacts the epitaxial layer and the second gate. The first contact plug is electrically connected to the second contact plug. The first doped region is disposed in the body layer between the first contact plug and the first gate.

According to an embodiment of the present invention, the second contact plug is embedded into a second gate.

According to an embodiment of the present invention, the second contact plug is disposed in the epitaxial layer in the third area and a portion of the second area. Moreover, the second gate is disposed under the second contact plug.

According to an embodiment of the present invention, the body layer in the second area covers a sidewall and a portion of a bottom of the second contact plug.

According to an embodiment of the present invention, the semiconductor structure further includes a second doped region of the second conductivity type, and the second doped region is disposed around a bottom and a portion of a sidewall of the first contact plug.

According to an embodiment of the present invention, the semiconductor structure further includes a dielectric layer and a metal layer. The dielectric layer is disposed on the substrate and exposes the first contact plug and the second contact plug. The metal layer is disposed on the substrate and covers the dielectric layer, the first contact plug and the second contact plug.

According to an embodiment of the present invention, a material of the metal layer includes AlSiCu, for example.

According to an embodiment of the present invention, the first contact plug and the second contact plug each include a first metal layer and a barrier layer around the first metal layer.

According to an embodiment of the present invention, a material of the first metal layer includes tungsten, for example.

According to an embodiment of the present invention, the first conductivity type is N-type and the second conductivity type is P-type. Alternatively, the first conductivity type is P-type and the second conductivity type is N-type.

According to an embodiment of the present invention, a cell pitch of the semiconductor structure is about 1.5 μm or smaller.

According to an embodiment of the present invention, a cell density of the semiconductor structure is about 300 M cell/inch$^2$ or greater.

According to an embodiment of the present invention, the second gate is at the same potential with the metal layer.

According to an embodiment of the present invention, the first area surrounds the second area and the second area surrounds the third area.

According to an embodiment of the present invention, the semiconductor structure further includes at least one third gate, and the third gate is disposed in the epitaxial layer in the third area and located under the second contact plug.

According to an embodiment of the present invention, the third gate is at the same potential with the metal layer.

In light of the foregoing, in the semiconductor structure of the present invention, since the tungsten contact plugs are disposed in the power MOSFET area and the Schottky diode area, the cell pitch (a distance between adjacent power MOSFETs) is reduced to about 1.5 µm or smaller and the cell density is increased to about 300 M cell/inch$^2$ or higher. Furthermore, the method of the present invention is simple, easy, and compatible with current formation processes and is thus a competitive method.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
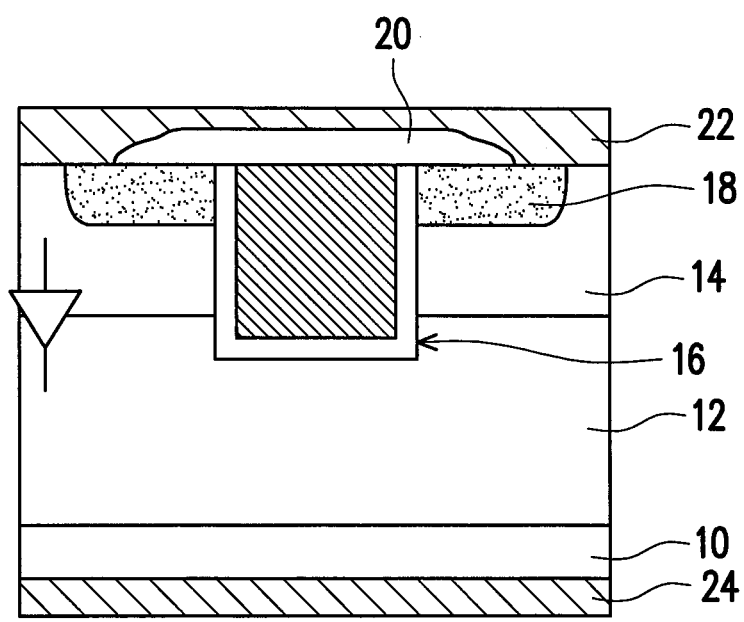
FIG. 1 illustrates a schematic cross-sectional view of a conventional power MOSFET.
Figure 2:
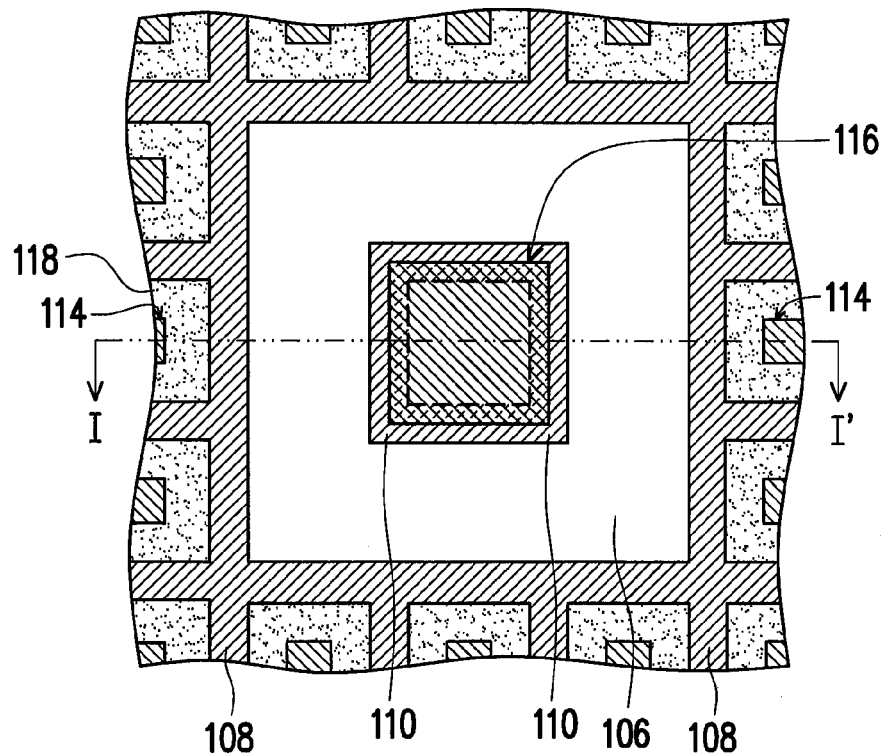
FIG. 2 illustrates a schematic top view of a semiconductor structure according to a first embodiment of the present invention; herein, the topmost metal layer and dielectric layer are omitted.

FIG. 2 illustrates a schematic top view of a semiconductor structure according to a first embodiment of the present invention. Here, the topmost metal layer and dielectric layer are omitted.

Referring to FIG. 2, in the semiconductor structure of the present invention, a floating diode surrounds the periphery of a Schottky diode and sixteen power MOSFETs surround the periphery of the floating diode. The numbers of the Schottky diodes, the floating diodes and the power MOSFETs are not limited by the present invention and are adjusted upon the process or design requirements. Generally, the number of the Schottky diodes occupies about a tenth to a thirtieth of the number of the power MOSFETs.

Figure 2A:
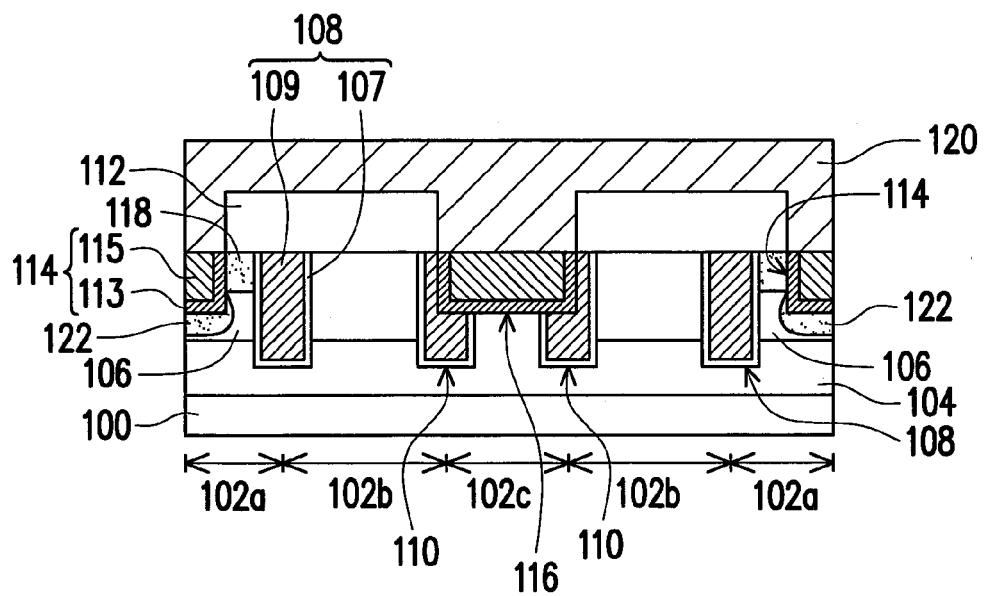
FIG. 2A is a schematic cross-sectional view taken along a line I-I' in FIG. 2.

FIG. 2A is a schematic cross-sectional view taken along a line I-I' in FIG. 2. Referring to FIG. 2A, the semiconductor structure of the present invention includes a substrate 100 of a first conductivity type. The substrate 100, for example, is an N-type heavily-doped (N+) silicon substrate. This N-type heavily-doped silicon substrate serves as a drain of the power MOSFET. The substrate 100 has a first area 102a, a second area 102b and a third area 102c. The second area 102b is disposed between the first area 102a and the third area 102c. As shown in the top view of FIG. 2, the first area 102a surrounds the second area 102b and the second area 102b surrounds the third area 102c. Accordingly, the cross-sectional view taken along a line I-I' in FIG. 2 shows two pieces of the first area 102a which are connected to each other (regards as "one" first area hereinafter), two pieces of the second area 102b which are connected to each other (regards as "one" second area hereinafter) and one third area 102c, as shown in FIG. 2A. The first area 102a is used for forming the power MOSFETs, the second area 102b is used for forming the floating diode, and the third area 102c is used for forming the Schottky diodes.

The semiconductor structure of the present invention further includes an epitaxial layer 104 of the first conductivity type, a body layer 106 of a second conductivity type, a first gate 108, a second gate 110, first contact plugs 114, a second contact plug 116 and first doped regions 118 of the first conductivity type.

The epitaxial layer 104 is disposed on the substrate 100. The epitaxial layer 104 is an N-type lightly-doped (N−) epitaxial layer, for example. The body layer 106 is disposed in the epitaxial layer 104 in the first area 102a and the second area 102b. The body layer 106, for instance, is a P-type body layer.

The first gate 108 and the second gate 110 are disposed in the body layer 106 and in a portion of the epitaxial layer 104 outside the body layer 106. The first gate 108 is disposed partially in the first area 102a and partially in the second area 102b. The second gate 110 is disposed partially in the second area 102b and partially in the third area 102c. As shown in FIG. 2, the second gate 110 is at the same potential with the metal layer 120 and shaped as a rectangular ring along the boundary between the second area 102b and the third area 102c. Accordingly, the cross-sectional view taken along a line I-I' in FIG. 2 shows two pieces of the second gate 108 which are connected to each other (regarded as "one" second gate hereinafter), as shown in FIG. 2A. Similarly, two pieces of the first gate 108 in FIG. 2A are connected to each other and regarded as "one" first gate hereinafter. Furthermore, the first gate 108 and the second gate 110 each include a polysilicon layer 109 and an oxide layer 107 around the polysilicon layer 109.

The first contact plugs 114 are disposed in a portion of the body layer 106 in the first area 102a. The second contact plug 116 is at least disposed in the epitaxial layer 104 in the third area 102c and contacting the epitaxial layer 104 and the second gate 110. In the present embodiment, the second contact plug 116 is disposed in the epitaxial layer 104 in the third area 102c and embedded into the second gate 110, as shown in FIG. 2A. In other words, the second gate 110 covers a sidewall and a portion of a bottom of the second contact plug 116. Moreover, the first contact plugs 114 and the second contact plug 116 each include a metal layer 115 and a barrier layer 113 around the metal layer 115. A material of the metal layer 115 is, for example, tungsten, and a material of the barrier layer 113 is titanium or titanium nitride, for instance. Each first doped region 118 is disposed in the body layer 106 between each first contact plug 114 and the first gate 108. The first doped regions 118 are N-type heavily-doped regions, for example. Each N-type heavily-doped region serves as the drain of the power MOSFET.

The semiconductor structure of the present invention further includes a dielectric layer 112, a metal layer 120 and second doped regions 122 of the second conductivity type. The dielectric layer 112 is disposed on the substrate 100 to expose the first contact plugs 114 and the second contact plug 116. The metal layer 120 is disposed on the substrate 100 and covers the dielectric layer 112, the first contact plugs 114 and the second contact plug 116. That is, the first contact plugs 114 and the second contact plug 116 are electrically connected via the metal layer 120. A material of the metal layer 120 is AlSiCu, for example. Each second doped region 122 is disposed on a bottom and a portion of a sidewall of each first contact plug 114. The second doped regions 122, for instance, are P-type heavily-doped (P+) doped regions to further reduce the resistance between the first contact plugs 114 and the body layer 106.

In the present embodiment, the first area 102a is for forming power MOSFETs. In the second area 102b, the second gate 110 is at the same potential with the metal layer 120, and the metal layer 120 is not in contact with the body layer 106. Therefore, the junction between the P-type body layer 106 and the N-type epitaxial layer 104 is a floating diode. In the third area 102c, since the epitaxial layer 104 is an N-type lightly-doped epitaxial layer, the junction between the second contact plug 116 and the N-type epitaxial layer 104 is a Schottky contact.

In the first embodiment, the third area 102c merely includes one Schottky diode as an illustration. However, the present invention is not limited thereto. In the following, multiple modifications of the first embodiment in which the third area 102c includes a plurality of Schottky diodes are illustrated.

Figure 3:
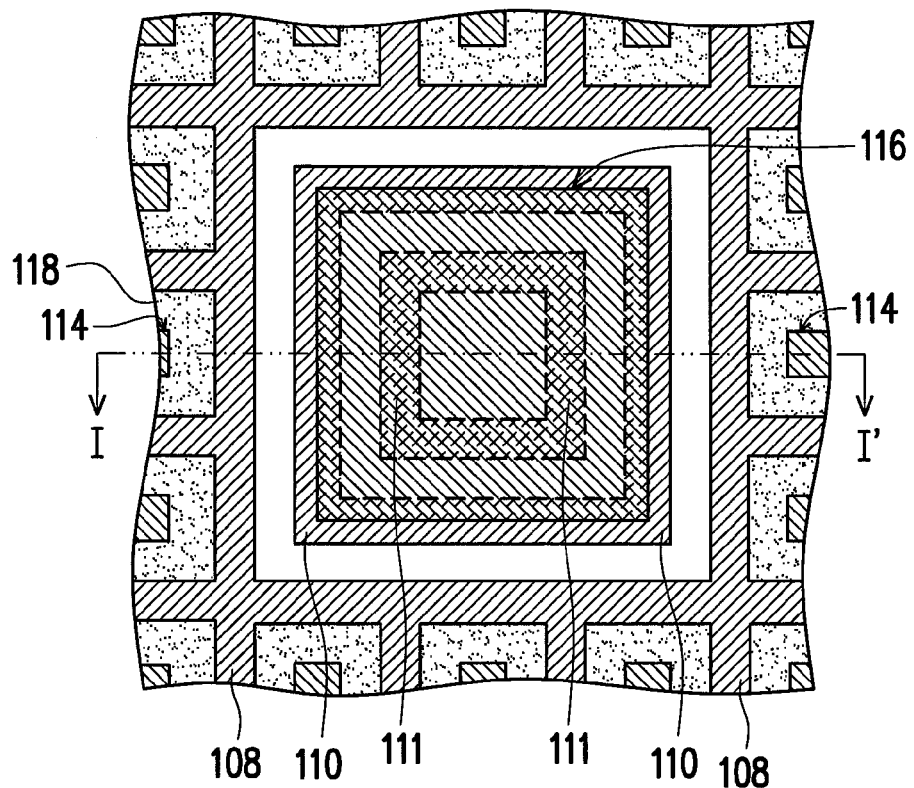
FIG. 3 illustrates a schematic top view of a modification of the semiconductor structure according to the first embodiment of the present invention; herein, the topmost metal layer and dielectric layer are omitted.
Figure 3A:
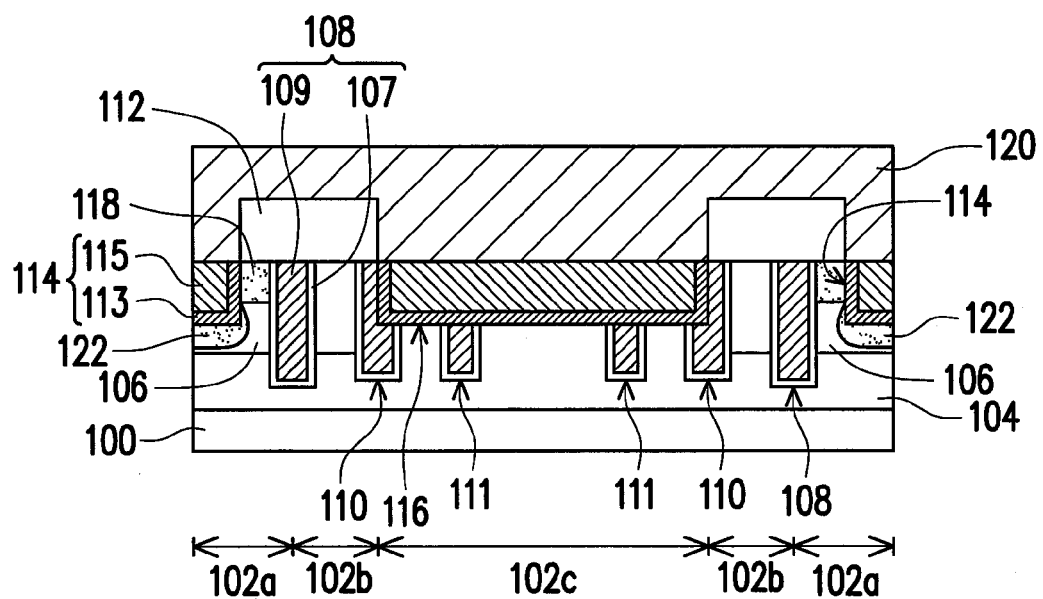
FIG. 3A is a schematic cross-sectional view taken along a line I-I' in FIG. 3.

FIG. 3 illustrates a schematic top view of a modification of the semiconductor structure according to the first embodiment of the present invention; herein, the topmost metal layer and dielectric layer are omitted. FIG. 3A is a schematic cross-sectional view taken along a line I-I' in FIG. 3.

Referring to FIG. 3, the semiconductor structure of the present invention further includes a third gate 111 shaped as a rectangular ring. Accordingly, the cross-sectional taken along a line I-I' in FIG. 3 shows two pieces of the third gate 111 which are connected to each other (regards as "one" third gate hereinafter), as shown in FIG. 3A. The third gate 111 is disposed in the epitaxial layer 104 in the third area 102c and located under the second contact plug 116. The second gate 110 shaped as a rectangular ring surrounds the periphery of the third gate 111, and the third gate 111 and the second gate 110 are all at the same potential with the metal layer 120. In this modified embodiment, the third area 102c includes two Schottky diodes. In addition, a floating diode surrounds the periphery of the two Schottky diodes and sixteen power MOSFETs surround the periphery of the floating diode.

Figure 4:
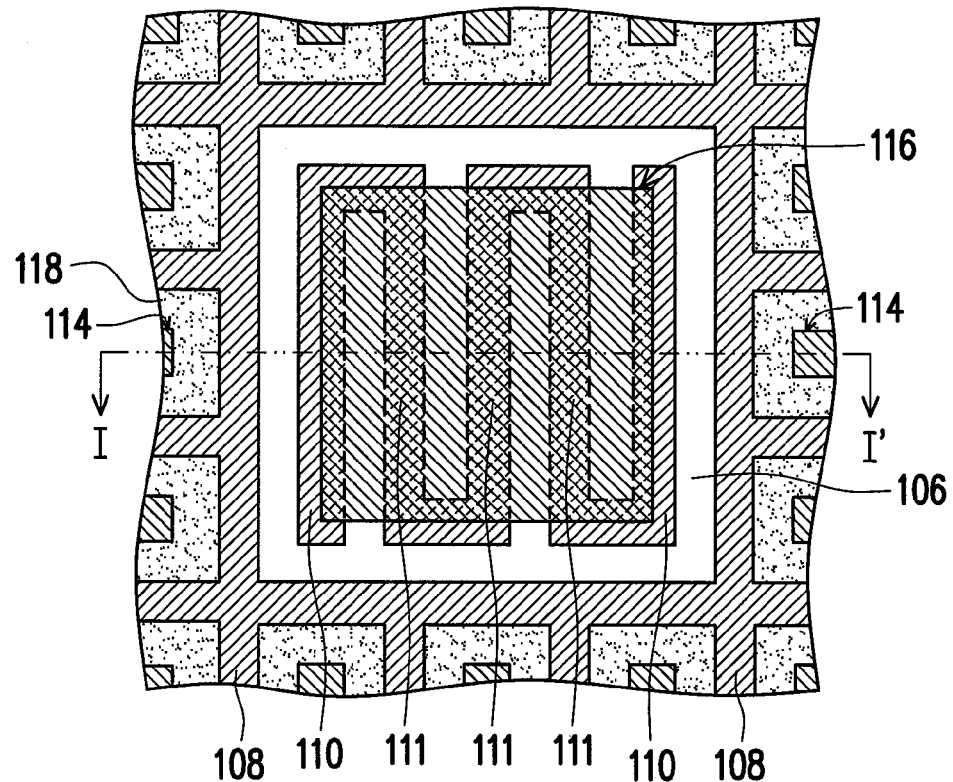
FIG. 4 illustrates a schematic top view of another modification of the semiconductor structure according to the first embodiment of the present invention; herein, the topmost metal layer and dielectric layer are omitted.
Figure 4A:
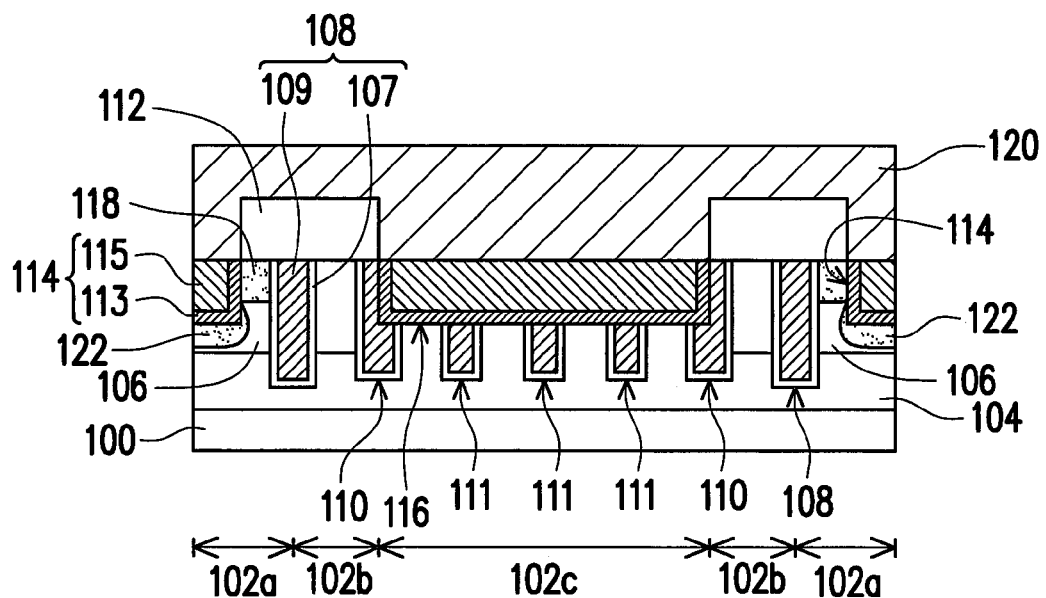
FIG. 4A is a schematic cross-sectional view taken along a line I-I' in FIG. 4.

FIG. 4 illustrates a schematic top view of another modification of the semiconductor structure according to the first embodiment of the present invention; herein, the topmost metal layer and dielectric layer are omitted. FIG. 4A is a schematic cross-sectional view taken along a line I-I' in FIG. 4.

Referring to FIG. 4, the semiconductor structure of the present invention further includes a third gate 111 formed as a snake shape. Accordingly, the cross-sectional taken along a line I-I' in FIG. 4 shows three pieces of the third gate 111 which are connected to each other (regards as "one" third gate hereinafter), as shown in FIG. 4A. The third gate 111 is disposed in the epitaxial layer 104 in the third area 102c and located under the second contact plug 116. The third gate 111 are connected to the second gate 110 arranged in stripes, and the third gate 111 and the second gate 110 are all at the same potential with the metal layer 120. In this modified embodiment, the third area 102c includes four Schottky diodes. In addition, a floating diode surrounds the periphery of the four Schottky diodes and sixteen power MOSFETs surround the periphery of the floating diode.

Figure 5:
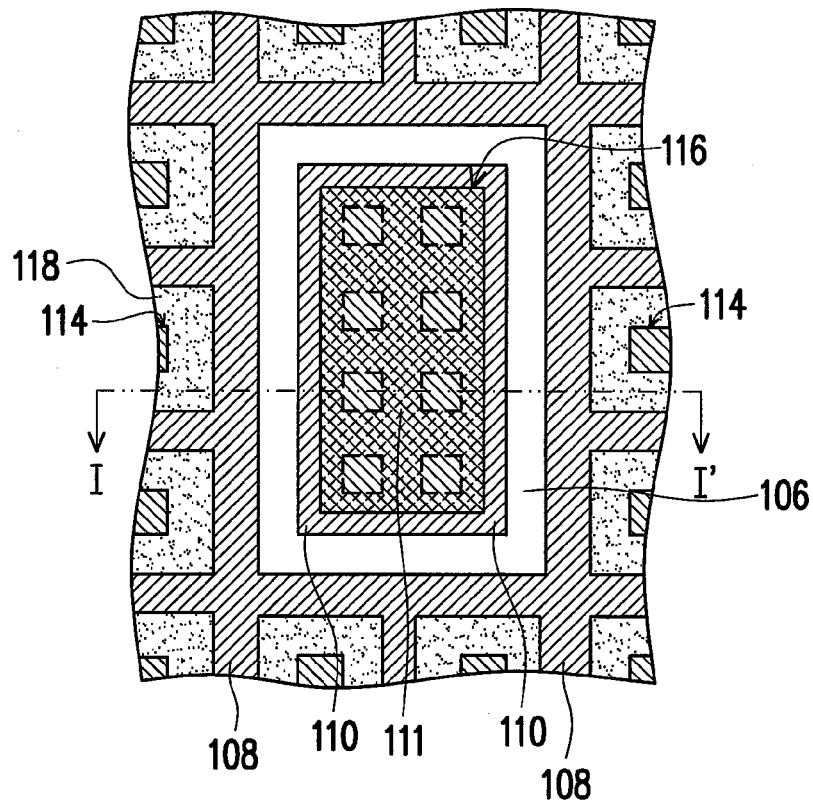
FIG. 5 illustrates a schematic top view of yet another modification of the semiconductor structure according to the first embodiment of the present invention; herein, the topmost metal layer and dielectric layer are omitted.
Figure 5A:
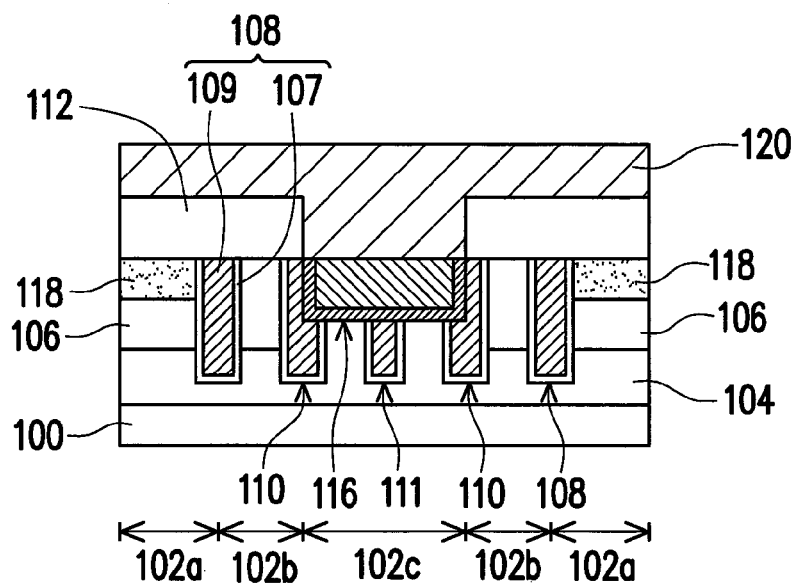
FIG. 5A is a schematic cross-sectional view taken along a line I-I' in FIG. 5.

FIG. 5 illustrates a schematic top view of yet another modification of the semiconductor structure according to the first embodiment of the present invention; herein, the topmost metal layer and dielectric layer are omitted. FIG. 5A is a schematic cross-sectional view taken along a line I-I' in FIG. 5.

As shown in FIG. 5, the semiconductor structure of the present invention further includes a third gate 111 substantially formed as a fishbone shape. As shown in FIG. 5A, the third gate 111 are disposed in the epitaxial layer 104 in the third area 102c and located under the second contact plug 116. The third gate 111 are connected to the second gate 110 shaped as a frame ring, and the third gate 111 and the second gate 110 are all at the same potential with the metal layer 120. In this modified embodiment, the third area 102c includes eight Schottky diodes. In addition, a floating diode surrounds the periphery of the eight Schottky diodes and fourteen power MOSFETs surround the periphery of the floating diode.

Figure 6:
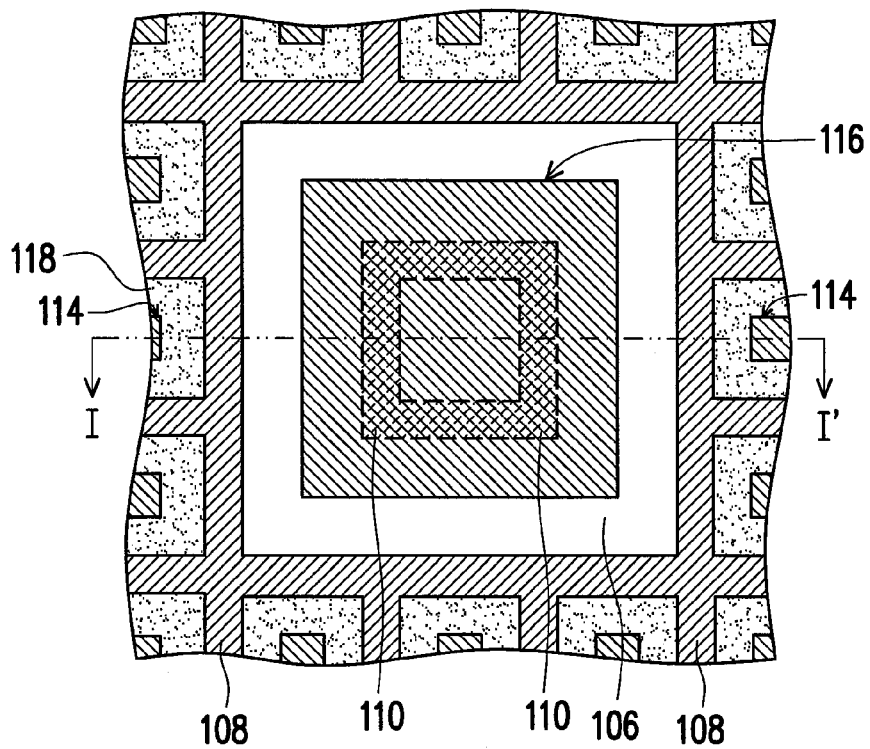
FIG. 6 illustrates a schematic top view of a semiconductor structure according to a second embodiment of the present invention; herein, the topmost metal layer and dielectric layer are omitted.
Figure 6A:
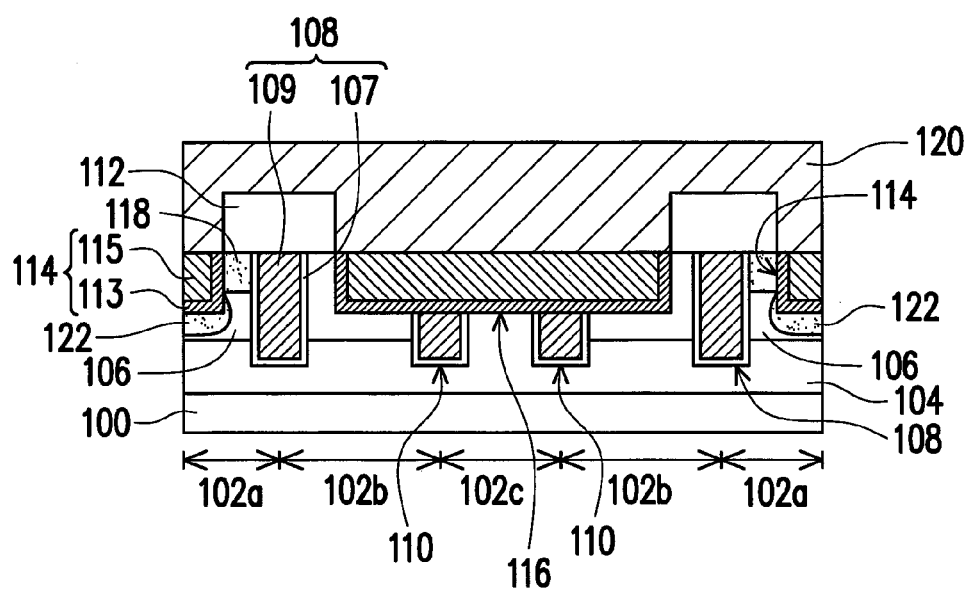
FIG. 6A is a schematic cross-sectional view taken along a line I-I' in FIG. 6.

FIG. 6 illustrates a schematic top view of a semiconductor structure according to a second embodiment of the present invention. Herein, the topmost metal layer and dielectric layer are omitted. FIG. 6A is a schematic cross-sectional view taken along a line I-I' in FIG. 6. The second embodiment is similar to the first embodiment. Nevertheless, the difference is that in the second embodiment, the second area 102b is for forming a body diode instead of the floating diode in the first embodiment. The illustration on the difference between the first and a second embodiments is described below, and the details are not iterated herein.

In the second embodiment, the dispositions of the dielectric layer 112, the second contact plug 116 and the metal layer 120 are different, so that a body diode is formed in the second area 102b, which is different from the technical feature of the floating diode forming in the second area 102b in the first embodiment. In details, the second contact plug 116 is disposed in the epitaxial layer 104 in the third area 102c and a portion of the second area 102b. Moreover, the second gate 110 is disposed under the second contact plug 116 as shown in FIG. 6A. Additionally, the body layer 106 in the second area 102b covers a sidewall and a portion of a bottom of the second contact plug 116. The dielectric layer 112 is disposed on the substrate 100 to expose the first contact plugs 114 and the second contact plug 116. The metal layer 120 is disposed on the substrate 100 and covers the dielectric layer 112, the first contact plugs 114 and the second contact plug 116.

In the present embodiment, the first area 102a is for forming power MOSFETs. Since the second contact plug 116 in the second area 102b is electrically connected to the metal layer 120, the junction between the P-type body layer 106 and the N-type epitaxial layer 104 is a body diode. In addition, the junction between the second contact plug 116 and the N-type epitaxial layer 104 in the third area 102c is a Schottky contact.

In the second embodiment, the third area 102c merely includes one Schottky diode as an illustration. However, the present invention is not limited thereto. Obviously, the third area 102c can also include a plurality of Schottky diodes and the modifications and improvements thereof can be referred to FIGS. 3-5 and FIGS. 3A-5A, and are thus not repeated herein.

In light of the foregoing, the semiconductor structure of the present invention includes a substrate, at least one power MOSFET, a floating diode or a body diode and at least one Schottky diode. The substrate has a first area, a second area and the third area. The second area is disposed between the first area and the third area. The at least one power MOSFET is disposed in the first area. The floating diode or body diode is disposed in the second area. The at least one Schottky diode is disposed in the third area. Furthermore, the contact plugs of the power MOSFET and the Schottky diode include tungsten and are electrically connected to each other.

In the semiconductor structure of the present invention, since the tungsten contact plugs are disposed in the power MOSFET area and the Schottky diode area, the cell pitch (a distance between adjacent power MOSFETs) is reduced from 2.0 μm to about 1.5 μm or smaller and the cell density is increased to 300 M cell/inch$^2$ or higher. Compared with the conventional SOP structure, the semiconductor structure of the present invention not only integrates the power MOSFET and the Schottky diode effectively, but also enhances the cell density, thereby greatly enhancing the competitiveness thereof.

A method of forming the semiconductor structure of the present invention is explained hereinafter. FIGS. 7A through 7E are cross-sectional views schematically depicting a method of forming a semiconductor structure according to the first embodiment of the present invention.

Figure 7A:
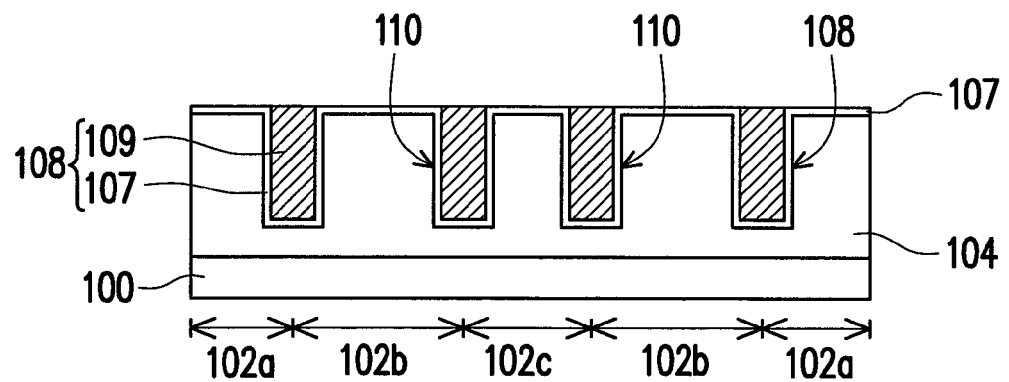
FIGS. 7A through 7E are cross-sectional views schematically depicting a method of forming a semiconductor structure according to the first embodiment of the present invention.

Firstly, referring to FIG. 7A, an epitaxial layer 104 of a first conductivity type is formed on a substrate 100 of the first conductivity type. The substrate 100, for example, is an N-type heavily-doped silicon substrate. The substrate 100 serves as a drain of the power MOSFET. The substrate 100 has two pieces of a first area 102a (regarded as "one" first area hereinafter), two pieces of a second area 102b (regarded as "one" second area hereafter) and a third area 102c. The second area 102b is disposed between the first area 102a and the third area 102c. In the present embodiment, the third area 102c is disposed in the center, and two pieces of the second area 102b and two pieces of the first area 102a are respectively disposed mirror-symmetrically to the third area 102c. The epitaxial layer 104, for example, is an N-type lightly-doped epitaxial layer, and a formation method thereof includes an epitaxial growth process.

Next, a first gate 108 and a second gate 110 are formed in the epitaxial layer 104. The first gate 108 is disposed partially in the first area 102a and partially in the second area 102b. The second gate 110 is disposed partially in the second area 102b and partially in the third area 102c. A method of forming the first gate 108 and the second gate 110 includes the following steps. First of all, trenches for forming the first gate 108 and the second gate 110 are etched in the epitaxial layer 104. Thereafter, an oxide layer 107 is conformally formed on the substrate 100 and surfaces of the trenches. A material used for forming the oxide layer 107 is, for example, silicon dioxide, and the method of forming the same is, for example, a thermal oxidation process. Afterwards, a polysilicon layer 109 is filled in the trenches. A method of forming the polysilicon layer 109 includes a chemical vapor deposition (CVD) process. During the step of forming the first gate 108 and the second gate 110 in the epitaxial layer 104, at least one third gate (not shown) is further formed in the epitaxial layer 104 if the final structure as shown in FIGS. 3-5 and FIGS. 3A-5A are required to form.

Figure 7B:
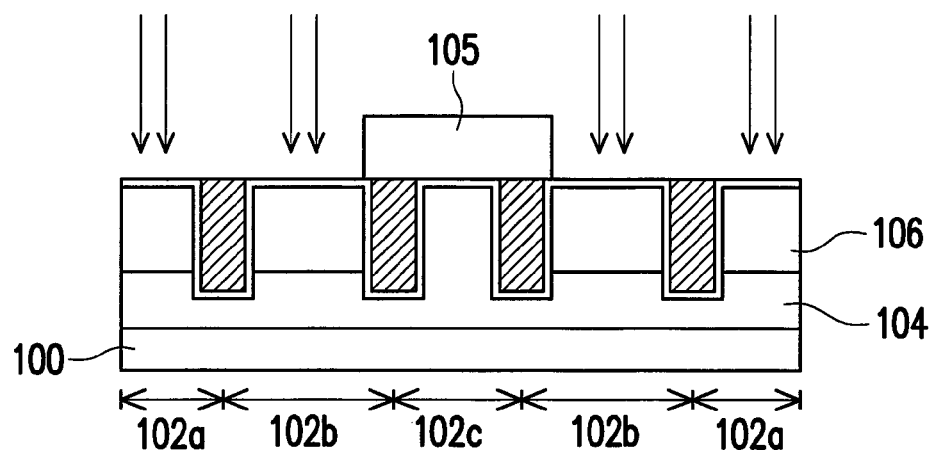

Referring to FIG. 7B, a patterned photoresist layer 105 is formed on the substrate 100. After that, an ion implantation process is performed by using the patterned photoresist layer 105 as a mask, so as to form a body layer 106 of a second conductivity type in the epitaxial layer 104 in the first area 102a and the second area 102b. The body layer 106, for instance, is a P-type body layer. Subsequently, the patterned photoresist layer 105 is removed and a drive-in process is performed. In this step, the third area is covered by the patterned photoresist layer 105, so as to avoid an undesired PN junction formed in the third area 102c, which is beneficial for the subsequent formation of the Schottky diode.

Figure 7C:
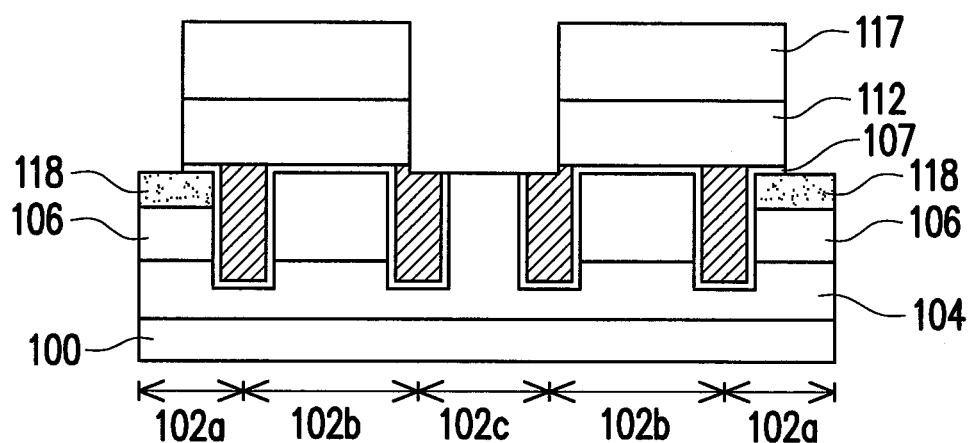

Referring to FIG. 7C, first doped regions 118 of the first conductivity type are formed in the body layer 106 in the first area 102a. The first doped regions 118 are N-type heavily-doped regions. Each N-type heavily-doped region serves as a source of the power MOSFET. A method of forming the first doped regions 118 includes an ion implantation process and the subsequent drive-in process. Next, a dielectric material layer (not shown) and a patterned photoresist layer 117 are sequentially formed on the substrate 100. Thereafter, a portion of the dielectric material layer and a portion of the oxide layer 107 are removed by using the patterned photoresist layer 117 as a mask, so as to form a dielectric layer 112. The dielectric layer 112 exposes a portion of the first doped regions 118 in the first area 102a, at least the epitaxial layer 104 in the third area 102c and at least a portion of the second gate 110. In the present embodiment, the dielectric layer 112 exposes a portion of the first doped regions 118 in the first area 102a, the epitaxial layer 104 in the third area 102b and a portion of the second gate 110.

Figure 7D:
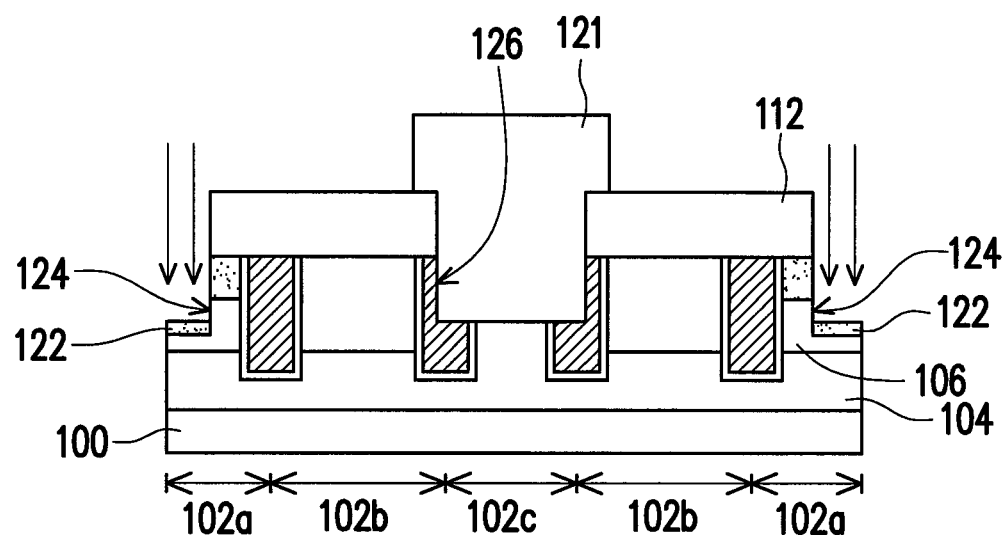

Referring to FIG. 7D, a portion of the body layer 106, a portion of the first doped regions 118, a portion of the epitaxial layer 104 and a portion of the second gate 110 are removed by using the dielectric layer 112 as a mask. Therefore, first openings 124 are formed in the first doped regions 118a and in a portion of the body layer 106 outside the first doped regions 118 in the first area 102a. Additionally, a second opening 126 is formed in the epitaxial layer 104 in the third area 102c and in a portion of the second gate 110a. Afterwards, a patterned photoresist layer 121 is formed on the substrate 100. The patterned photoresist layer serves as a mask for carrying out an ion implantation process so as to form second doped regions 122 of the second conductivity type in bottoms of the first openings 124. The second doped regions 122 are P-type heavily-doped regions, for example. In this step, the same mask for forming the body layer 106 (refer to FIG. 7B) is used for forming the second doped regions 122. In other words, the same body layer mask can be used twice, and no additional masks are required to complete the second doped regions 122. In this step, not only are the second doped regions 122 formed to further reduce the resistance between the body layer 106 and the subsequently formed first contact plugs 114, but the patterned photoresist layer 121 covering the third area 102c prevents the formation of an undesired PN junction in the third area 102c, which is beneficial for the subsequent formation of the Schottky diode.

Figure 7E:
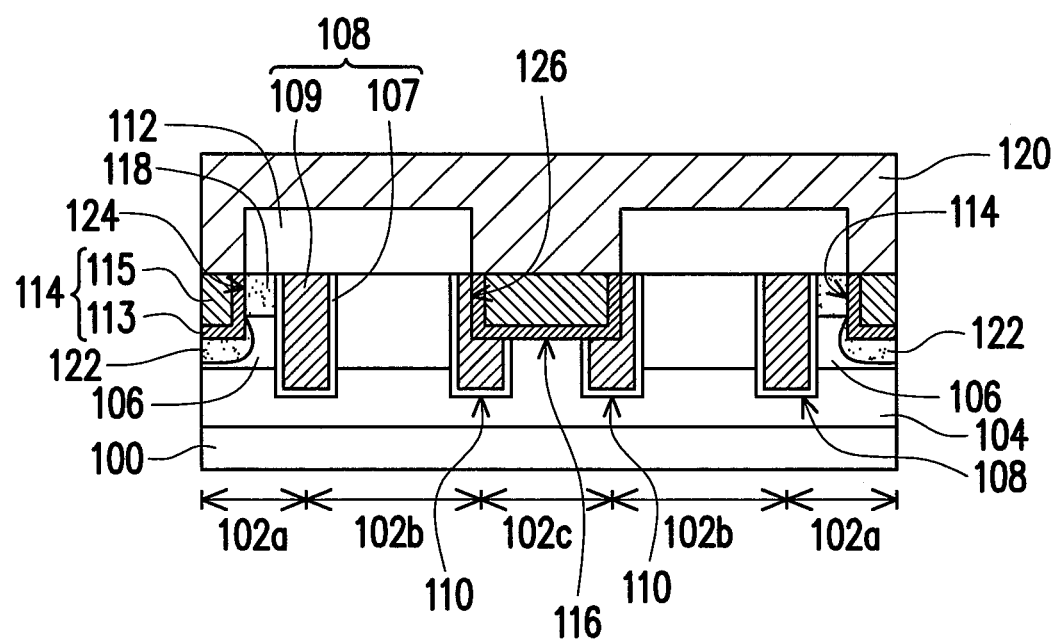

Referring to FIG. 7E, the patterned photoresist layer 121 is removed and the drive-in process is performed. In this step, high temperature causes the second doped regions 122 to diffuse to a periphery thereof, thereby covering a portion of sidewalls of the first openings 124. Thereafter, a barrier layer 113 and a metal layer 115 are sequentially filled in the first openings 124 and the second opening 126. A material of the barrier layer 113 is, for example, titanium or titanium oxide, and a material of the metal layer 115 is tungsten, for instance. A method of forming the barrier layer 113 and the metal layer 115 includes a sputtering or CVD process. The barrier layer 113 and the metal layer 115 in the first openings 124 form first contact plugs 114. The barrier layer 113 and the metal layer 115 in the second opening 126 form a second contact plug 116. Thereafter, a metal layer 120 is formed on the substrate 100 to cover the dielectric layer 112, the barrier layer 113 and the metal layer 115. Up to this point, the formation of the power MOSFETs in the first area 102a, the floating diode in the first area 102a and the Schottky diode in the third area 102c are completed.

Figure 8A:
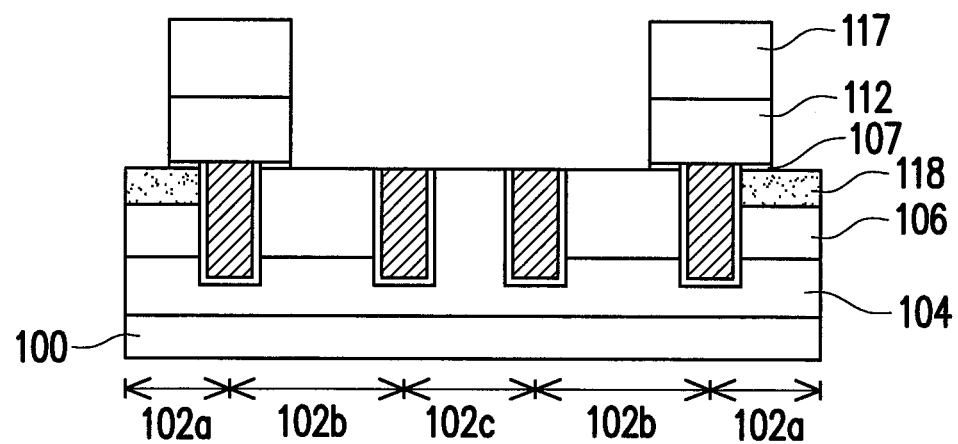
FIGS. 8A through 8B are cross-sectional views schematically depicting a method of forming a semiconductor structure according to the second embodiment of the present invention.
Figure 8B:
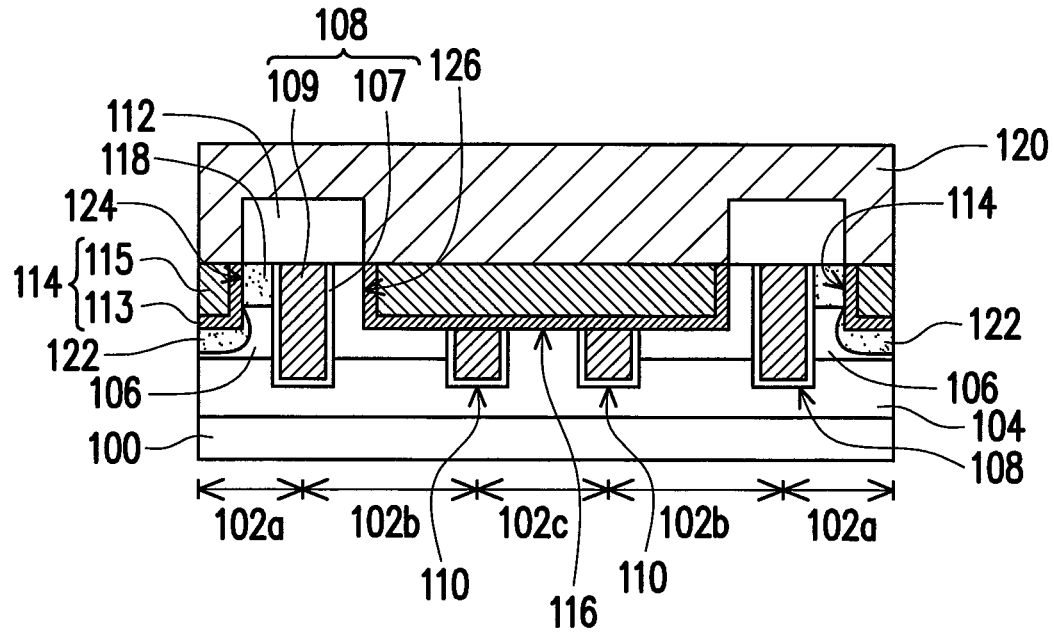

FIGS. 8A to 8B are cross-sectional views schematically depicting a method of forming a semiconductor structure according to the second embodiment of the present invention. The difference between the second embodiment and the first embodiment is that in the second embodiment, the second area 102b is for forming a body diode instead of the floating diode in the first embodiment. The differences of the first embodiment and the second embodiment are illustrated in the following, and the details are not iterated herein.

First of all, an intermediate structure as shown in FIG. 7B is provided. Next, the patterned photoresist layer 105 is removed. Referring to FIG. 8A, first doped regions 118 of the first conductivity type are formed in the body layer 106 in the first area 102a. The first doped regions 118 are the N-type heavily-doped regions, for example. Next, the dielectric material layer (not shown) and the patterned photoresist layer 117 are sequentially formed on the substrate 100. Thereafter, a portion of the dielectric material layer and a portion of the oxide layer 107 are removed by using the patterned photoresist layer 117 as a mask, so as to form a dielectric layer 112. The dielectric layer 112 exposes a portion of the first doped regions 118 in the first area 102a, the epitaxial layer 104 in the third area 102c, the entire second gate 110, and a portion of the body layer 106 in the second area 102b.

Referring to FIG. 8B, a portion of the body layer 106, a portion of the first doped regions 118, a portion of the epitaxial layer 104 and a portion of the second gate 110 are removed by using the dielectric layer 112 as a mask. Therefore, first openings 124 are formed in the first doped regions 118 and a portion of the body layer 106 outside the first doped regions 118 in the first area 102a. Additionally, a second opening 126 is formed in the epitaxial layer 104 in the third area 102c and a portion of the second area 102b. After that, second doped regions 122 of the second conductivity type are formed in bottoms of the first openings 124. The second doped regions 122 are the P-type heavily-doped regions, for example. Thereafter, a barrier layer 113 and a metal layer 115 are sequentially filled in the first openings 124 and the second opening 126. The metal layer 120 is then formed on the substrate 100 to cover the dielectric layer 112, the barrier layer 113 and the metal layer 115.

In the embodiments illustrated, the first conductivity type is N-type and the second conductivity type is P-type. However, the present invention is not limited thereto. People skilled in the art should understand that the first conductivity type can also be P-type while the second conductivity type is N-type.

In summary, in the semiconductor structure of the present invention, at least one Schottky diode is disposed inside a plurality of power MOSFETs. Moreover, the power MOSFETs and the Schottky diode are separated by the floating diode or body diode. By disposing the tungsten contact plugs that are electrically connected to one another in the power MOSFET area and the Schottky area, not only are the power MOSFET and the Schottky diode integrated effectively, but the cell pitch (a distance between adjacent power MOSFETs) can be reduced from 2.0 µm to about 1.5 µm or smaller. Hence, the power MOSFET area and the Schottky area are integrated using the SOP technique, and the cell density is increased to about 300 M cell/inch$^2$ or higher, thereby greatly enhancing the competitiveness thereof. Moreover, the method in accordance with the present invention does not require additional masks to complete the semiconductor structure of the present invention. The process is simple and compatible with the conventional processes.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor structure, comprising:
a substrate of a first conductivity type, having a first area, a second area and a third area, wherein the second area is disposed between the first area and the third area;
an epitaxial layer of the first conductivity type, disposed on the substrate;
a body layer of a second conductivity type, disposed in the epitaxial layer in the first area and the second area;
a first gate and a second gate, disposed in the body layer and in a portion of the epitaxial layer outside the body layer, wherein the first gate is disposed in the substrate, partially in the first area and partially in the second area, and the second gate is disposed in the substrate, partially in the second area and partially in the third area;
a first contact plug, disposed in a portion of the body layer in the first area;
a second contact plug, at least disposed in the epitaxial layer in the third area and physically and electrically contacting the epitaxial layer and the second gate, wherein the first contact plug is electrically connected to the second contact plug;
a first doped region of the first conductivity type, disposed in the body layer between the first contact plug and the first gate; and
at least one third gate, disposed in the epitaxial layer in the third area and located under the second contact plug.

2. The semiconductor structure as claimed in claim 1, wherein the second contact plug is embedded into the second gate.

3. The semiconductor structure as claimed in claim 1, wherein the second contact plug is disposed in the epitaxial layer in the third area and a portion of the second area, and the second gate is disposed under the second contact plug.

4. The semiconductor structure as claimed in claim 3, wherein the body layer in the second area covers a sidewall and a portion of a bottom of the second contact plug.

5. The semiconductor structure as claimed in claim 1, further comprising a second doped region of the second conductivity type disposed around a bottom and a portion of a sidewall of the first contact plug.

6. The semiconductor structure as claimed in claim 1, further comprising:
a dielectric layer, disposed on the substrate and exposing the first contact plug and the second contact plug; and a metal layer, disposed on the substrate and covering the dielectric layer, the first contact plug and the second contact plug.

7. The semiconductor structure as claimed in claim 6, wherein a material of the metal layer comprises AlSiCu.

8. The semiconductor structure as claimed in claim 6, wherein the second gate is at the same potential with the metal layer.

9. The semiconductor structure as claimed in claim 6, wherein the third gate is at the same potential with the metal layer.

10. The semiconductor structure as claimed in claim 1, wherein the first contact plug and the second contact plug each comprise a first metal layer and a barrier layer around the first metal layer.

11. The semiconductor structure as claimed in claim 10, wherein a material of the first metal layer comprises tungsten.

12. The semiconductor structure as claimed in claim 1, wherein the first conductivity type is N-type while the second conductivity type is P-type; or the first conductivity type is P-type while the second conductivity type is N-type.

13. The semiconductor structure as claimed in claim 1, wherein a cell pitch of the semiconductor structure is smaller than or equal to about 1.5 μm.

14. The semiconductor structure as claimed in claim 1, wherein a cell density of the semiconductor structure is greater than or equal to about 300 M cell/inch$^2$.

15. The semiconductor structure as claimed in claim 1, wherein the first area surrounds the second area and the second area surrounds the third area.

\* \* \* \* \*